(12) United States Patent
Suzuki et al.

(10) Patent No.: US 6,555,819 B1
(45) Date of Patent: Apr. 29, 2003

(54) SCANNING ELECTRON MICROSCOPE (75) Inventors: Naomasa Suzuki, Hitachinaka (JP); Toshiro Kubo, Hitachinaka (JP); Noriaki Arai, Hitachinaka (JP); Mitsugu Sato, Hitachinaka (JP); Hideo Todokoro, Hinode-machi (JP); Yoichi Ose, Mito (JP)

(73) Assignee: Hitachi, Ltd., Tokyo (JP)

( * ) Notice: Subject to any disclaimer, the term of this patent is extended or adjusted under 35 U.S.C. 154(b) by 22 days.

(21) Appl. No.: 09/679,006

(22) Filed: Oct. 4, 2000

(30) Foreign Application Priority Data

Oct. 5, 1999 (JP) ............................................. 11-284883

(51) Int. Cl.$^7$ ............................................. H01J 37/244
(52) U.S. Cl. ....................... 250/311; 250/310; 250/397; 250/307; 250/251
(58) Field of Search ................................. 250/311, 310, 250/397, 307, 251

(56) References Cited

U.S. PATENT DOCUMENTS

| 4,670,652 A | 6/1987 | Ichihashi et al. |
| 4,670,662 A | 6/1987 | Goldstein et al. |
| 5,659,172 A | 8/1997 | Wagner et al. |
| 5,939,720 A * | 8/1999 | Todokoro .................... 250/310 |
| 5,973,323 A * | 10/1999 | Adler et al. ................. 250/310 |
| 6,066,849 A * | 5/2000 | Masnaghetti et al. ....... 250/310 |

FOREIGN PATENT DOCUMENTS

JP 6-43885 6/1994

* cited by examiner

Primary Examiner—Bruce Anderson
Assistant Examiner—Zia R. Hashmi
(74) Attorney, Agent, or Firm—Kenyon & Kenyon (57) ABSTRACT Image observation at high resolution is realized and irregularity information of a sample is obtained.

The reflected electrons 12a emitted in a direction at a small angle with the surface of the sample 8 are detected by the detectors 10a and 10b arranged on the side of the electron source 1 of the magnetic field leakage type object lens 7 and a sample image is formed. Irregularity information of the sample is obtained from the effects of light and shade appearing in the sample image.

22 Claims, 9 Drawing Sheets

SCANNING ELECTRON MICROSCOPE

BACKGROUND OF THE INVENTION

The present invention relates to a scanning electron microscope for detecting a signal generated from a sample by irradiation of an electron beam and forming a scanned image of the sample.

A scanning electron microscope is an apparatus for scanning an electron beam which is generated from an electron source and finely limited by a focusing lens and an object lens on a sample using a deflector, detecting a signal generated from the sample by irradiation of the electron beam by a detector, and forming a sample image by processing the detection signal in synchronization with scanning of the electron beam. In order to improve the yielding rate of semiconductor devices, it is important to observe and analyze foreign substances and faults on devices. In correspondence with recent super refinement of semiconductor elements, observation and analysis of fine foreign substances and faults on semiconductor devices are required and for observation of foreign substances and faults, a scanning electron microscope is used instead of an optical microscope.

Information on irregularity such that observed foreign substances and faults are hollowed or projected is important information for analysis of foreign substances and faults. As a method for obtaining irregularity information of a sample, as described in Japanese Patent Publication 6-043885, there is a method for detecting a signal emitted in a direction at a small angle with the sample surface and forming a sample image. To observe fine foreign substances and faults, improvement of the resolution of a scanning electron microscope is desired. As a means for improvement of the resolution, by a method for bringing a sample close to an object lens or for leaking the magnetic field of an object lens on the sample side, the distance between the main surface of the object lens and the sample is made shorter.

According to the aforementioned prior art, a detector for detecting a signal emitted in a direction at a small angle with the sample surface must be arranged so as to look steadily at the electron beam irradiation position onto the sample and is inevitably arranged between the object lens and the sample. However, when the distance between the object lens and the sample is made shorter for improvement of the resolution, a problem arises that the amount of signals which can be detected by the detector is reduced and the SN ratio of sample images lowers. When an object lens of a magnetic field leakage type is used for improvement of the resolution, a problem arises that the track of a signal generated from a sample is bent by the magnetic field of the object lens and the signal cannot arrive at the detector.

SUMMARY OF THE INVENTION

The present invention was developed in consideration of the aforementioned problems of the prior arts and is intended to provide a scanning electron microscope for observing images at high resolution and obtaining irregularity information of a sample.

When an electron beam is irradiated onto the surface of a sample which is uneven due to foreign substances, the emission direction of reflected electrons emitted in a direction at a small angle with the sample surface from the uneven inclined parts is directive. Namely, most of the reflected electrons are emitted in the direction of the inclined surface and few reflected electrons are emitted in the backward direction of the inclined surface. Therefore, in a reflected electron image formed by detecting reflected electrons emitted in a specific direction from the sample, information concerning the inclination direction of inclined surface existing on the sample surface is included. By analysis of this inclination direction, irregularity information of the sample surface is obtained.

To detect reflected electrons emitted in a direction at a small angle with the sample surface by a scanning electron microscope having a short distance between the main surface of an object lens and a sample, according to the present invention, a detector is arranged on the side of an electron source of a magnetic field leakage type object lens and by controlling any one of or both of a negative voltage applied to the sample and an acceleration voltage for accelerating reflected electrons emitted from the sample, reflected electrons emitted in a direction at a small angle with the sample surface are detected. Reflected electrons emitted in a direction at a small angle with the sample surface are emitted from the sample by applying a negative voltage to the sample, and the track thereof is bent in the direction of the optical axis of the electron beam by the leakage magnetic field of the object lens, and the reflected electrons pass through the object lens by the acceleration electric field and is detected by the detector arranged on the electron source side by the object lens.

Namely, the scanning electron microscope of the present invention is characterized in that it has an electron source for generating an electron beam, a focusing lens for focusing the electron beam, a magnetic field type object lens for finely limiting the focused electron beam and irradiating it onto a sample, a deflector for two-dimensionally scanning the electron beam on the sample, a detector arranged on the electron source side of the object lens so as to detect a signal emitted from the sample by irradiation of the electron beam, a display means for displaying the signal detected by the detector as a sample image, a deceleration electric field generation means for generating an electric field for decelerating the electron beam to be irradiated onto the sample, and a voltage control means for controlling a voltage applied to the deceleration electric field generation means, and the voltage control means controls the voltage to be applied to the deceleration electric field generation means so that reflected electrons emitted in a direction at a small angle with the sample surface among the signal generated from the sample are detected by the detector, and a sample image having effects of light and shade in correspondence with the irregularity of the sample surface can be obtained.

The deceleration electric field generation means generates a deceleration electric field by applying a negative voltage to a sample. The deceleration electric field generation means may include an acceleration electric field generation means for generating an electric field for accelerating reflected electrons generated from the sample in the direction of the electron source and a voltage control means for controlling a voltage to be applied to the acceleration electric field generation means.

The scanning electron microscope of the present invention is also characterized in that it has an electron source for generating an electron beam, a focusing lens for focusing the electron beam, a magnetic field type object lens for finely limiting the focused electron beam and irradiating it onto a sample, a deflector for secondarily scanning the electron beam on the sample, a detector arranged on the electron source side of the object lens so as to detect a signal emitted from the sample by irradiation of the electron beam, a display means for displaying the signal detected by the detector as a sample image, an acceleration electric field generation means for generating an electric field for accelerating the signal generated from the sample, and a voltage control means for controlling a voltage to be applied to the acceleration electric field generation means, and the voltage control means controls the voltage to be applied to the acceleration electric field generation means so that reflected electrons emitted in a direction at a small angle with the sample surface among the signal generated from the sample are detected by the detector, and a sample image having effects of light and shade in correspondence with the irregularity of the sample surface can be obtained.

The object lens of the scanning electron microscope of the present invention may be of a type of generating a leakage magnetic field in a sample atmosphere.

It is possible to install a plurality of detectors for detecting reflected electrons emitted in a direction at a small angle with the sample surface in symmetrical positions about the optical axis of the electron beam and obtain sample images having different effects of light and shade for irregularity of the sample surface by detection signals of the detectors. Although irregularity information of the sample can be obtained only by one detector, when a pair of detectors are installed in symmetrical positions about the optical axis of the electron beam and two sample images on the basis of detection signals of the detectors are compared, the irregularity of the sample can be evaluated more precisely. The shade of a reflected electron image also appears due to a local change of the material of the sample. The shade of a reflected electron image caused by a local change of the material appears in the same position of each of the aforementioned two sample images in the same way. On the other hand, the brightness and darkness of a reflected electron image caused by the shape of the sample, that is, irregularity are reversed in the aforementioned two reflected electron images such that the bright position of one reflected electron image is the dark position of another reflected electron image. Therefore, when the positions in the two reflected electron images where the brightness and darkness are reversed are identified and the light and shade positions and the emission direction of reflected electrons contributing to forming of the images are combined and analyzed, the direction of the inclined surface existing on the sample surface can be known and furthermore, whether the position held between the light portion and the dark portion is projected from the sample surface or hollowed in the sample surface can be known.

The brightness and darkness of a sample image, in consideration of rotation of reflected electrons detected by the detector due to the magnetic field of the object lens, must correspond to the irregularity of the sample surface. In order to analyze the irregularity of the sample surface on the basis of the brightness and darkness of the sample image, it is necessary to confirm the emission direction of reflected electrons to the sample which are detected by the detector instead of the location relationship of the detector in the scanning electron microscope and analyze the brightness and darkness of the sample image according to the relationship between the sample and the reflected electrons emission direction. The rotary rate of reflected electrons in the magnetic field of the object lens can be known from the exciting current of the object lens and the acceleration voltage of the primary electron beam and on the basis of the rotary rate, the direction in which reflected electrons are emitted from the sample which are detected by the detector can be known.

Instead of directly detecting reflected electrons emitted in a direction at a small angle with the sample surface by the detector, it is possible to allow reflected electrons to collide with a conductor plate once and detect secondary electrons generated from the conductor plate. Namely, a conductor plate having an opening for passing the electron beam is installed on the electron source side of the object lens and the opening size of the conductor plate and the intensity of the deceleration electric field or the acceleration electric field may be set so that most of secondary electrons emitted from a sample pass through the opening and reflected electrons emitted in a direction at a small angle with the sample surface collide with the conductor plate. In this case, in a position which is expected as a detection direction of secondary electrons emitted from the conductor plate due to collision of reflected electrons, the detector is arranged.

It is also possible to install a second detector on the electron source side of the aforementioned detector for detecting reflected electrons emitted in a direction at a small angle with the sample surface and detect any one of or both of secondary electrons generated from the sample and reflected electrons emitted in a direction at a large angle with the sample surface by the second detector. By using a detection signal of the second detector, a general scanning electron microscope image can be displayed on the display means.

On the display means, a sample image by reflected electrons emitted in a direction at a small angle with the sample surface can be displayed. Irregularity information of the sample surface can be displayed on the display means. Irregularity information of the sample surface may be displayed independently of a sample image and may be overlaid on a sample image.

DETAILED DESCRIPTION OF THE PREFERRED EMBODIMENTS

The embodiments of the present invention will be explained hereunder with reference to the accompanying drawings. In FIG. 2 and the subsequent drawings, each of the parts having the same functions as those shown in FIG. 1 is assigned with the same number and the duplicated explanation will be omitted.

Figure 1:
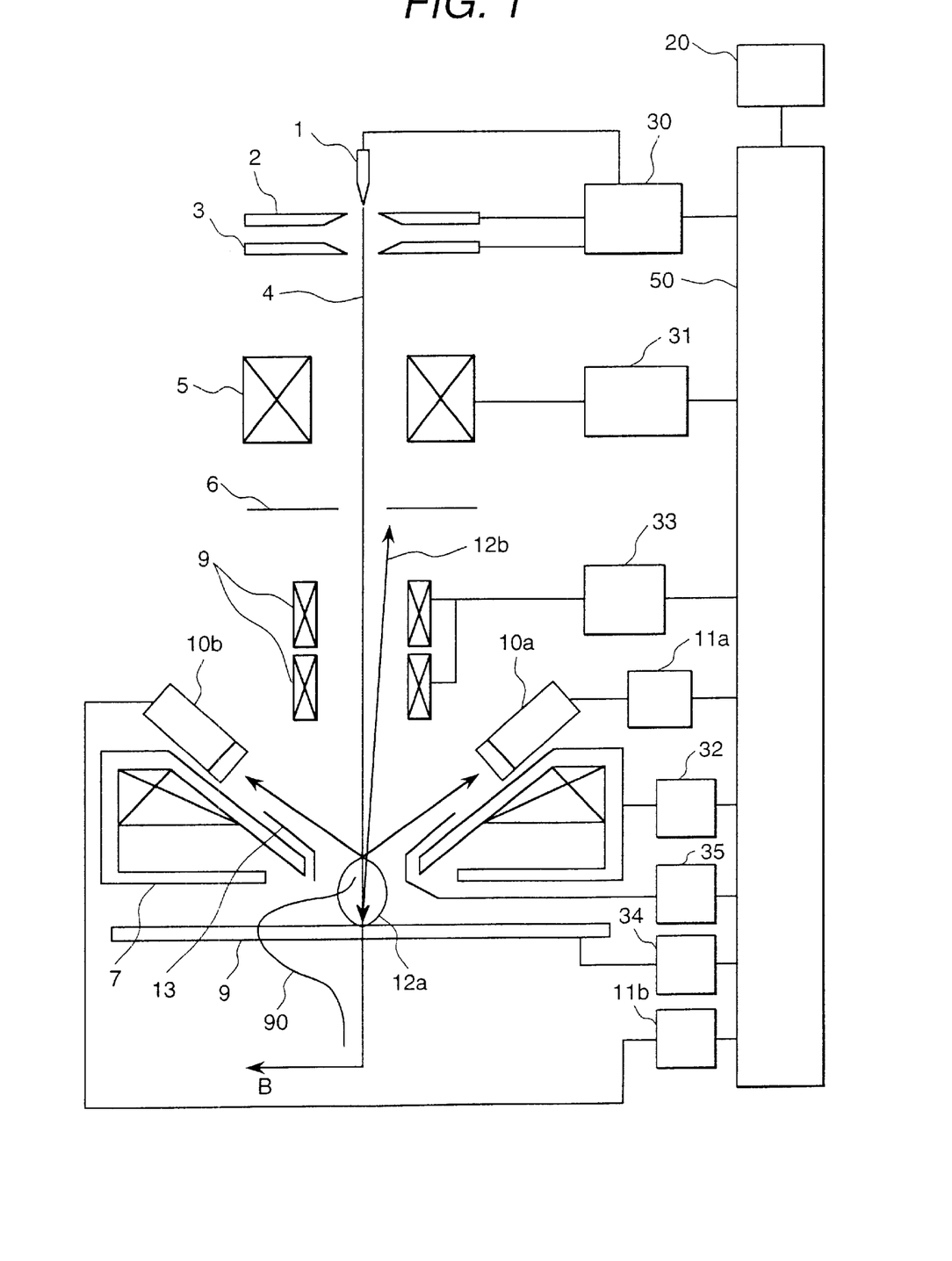
FIG. 1 is a schematic cross sectional view showing an example of a scanning electron microscope of the present invention.
Figure 2:
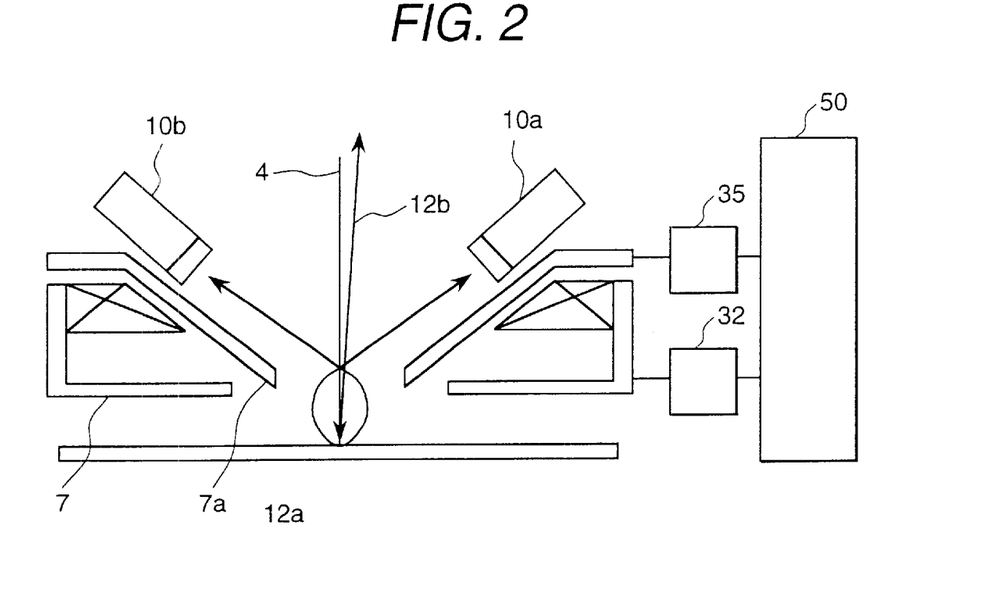
FIG. 2 is a schematic view showing an example that a magnetic path which is a part of an object lens is used as an acceleration electrode.

FIG. 1 is a schematic cross sectional view showing an example of a scanning electron microscope of the present invention. Between a cathode 1 and a first anode 2, a voltage is applied by a high voltage control power source 30 under control of a microprocessor (CPU) 50 and a predetermined emission current is pulled out from the cathode 1. Between the cathode 1 and a second anode 3, an acceleration voltage is applied by the high voltage control power source 30 under control of CPU 50, so that the primary electron beam 4 emitted from the cathode I is accelerated and moves forward the lens system at the later stage. The primary electron beam 4 is focused by a focusing lens 5 controlled by a lens control power source 31 and the unnecessary area of the primary electron beam 4 is removed by a limiting plate 6. Thereafter, by an object lens 7 controlled by an object lens control power source 32, the primary electron beam 4 is focused on a sample 8 as a minute spot and secondarily scanned on the sample by a deflecting coil 9. A scanning signal of the deflecting coil 9 is controlled by a deflecting coil control power source 33 according to the observation magnification. The object lens 7, as an intensity distribution 90 of a magnetic field B is briefly indicated, is an electromagnetic lens of a type that the magnetic field leaks on the side of the sample 8. To the sample 8, a negative voltage is applied by a sample application voltage control power source 34.

On the electron source (cathode 1) side of the object lens 7, detectors 10a and 10b are arranged. A signal detected by the detectors 10a and 10b is amplified by amplifiers 11a and 11b, processed by the CPU 30 in synchronization with scanning of the primary electron beam 4, and displayed on an image display unit 20 as a sample image. Between the sample 8 and the detectors 10a and 10b, an acceleration electrode 13 for generating an electric field for accelerating reflected electrons 12a and 12b emitted from the sample 8 by irradiation of the primary electron beam 4 is arranged. The voltage to be applied to the acceleration electrode 13 is controlled by an application voltage control power source 35.

In this case, there is no need to use a particular electrode for the acceleration electrode 13 and as shown in FIG. 2, it is possible to use a magnetic path 7a which is a part of the object lens 7 as an acceleration electrode and apply a voltage to the magnetic path 7a from the application voltage control power source 35.

Among the reflected electrons 12a and 12b emitted from the sample 8 by irradiation of the primary electron beam 4, the reflected electrons 12a emitted in a direction (direction almost parallel with the surface of the sample 8) at a small angle with the surface of the sample 8 are bent on the side of the object lens 7 by a negative voltage applied to the sample 8 and pass through the object lens 7 additionally after the track thereof is bent toward the center of the object lens 7 by the leakage magnetic field of the object lens 7. The reflected electrons 12a passing though the object lens 7 are accelerated by a positive voltage applied to the acceleration electrode 13, move toward the electron source (cathode 1) side from the object lens 7, and detected by the detectors 10a and 10b. On the other hand, the reflected electrons 12b emitted in a direction (direction almost perpendicular to the surface of the sample 8) at a large angle with the surface of the sample 8 pass through almost the same track as that of the primary electron beam 4, so that they cannot be detected by the detectors 10a and 10b. So that only the reflected electrons 12a in a direction at a small angle with the surface of the sample 8 can be detected by the detectors 10a and 10b like this, the installation positions of the detectors 10a and 10b and the negative voltage which is to be applied to the sample 8 from the sample application voltage control power source 34 or the voltage to be applied to the acceleration electrode 13 are adjusted.

Figure 3A:
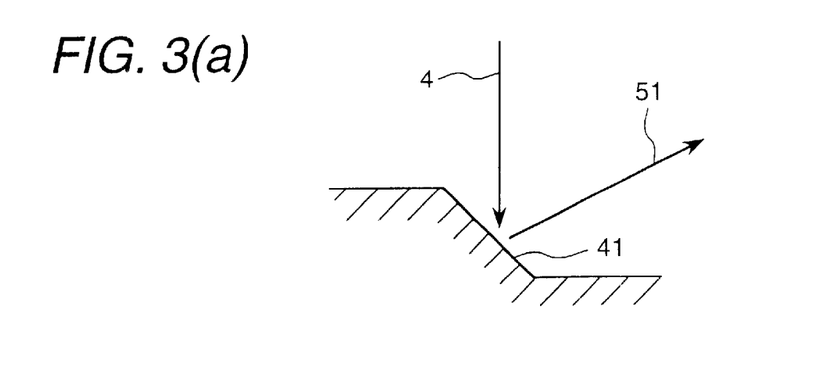
FIG. 3 is a schematic view showing a primary electron beam for irradiating an inclined part of a sample surface and reflected electrons.
Figure 3B:
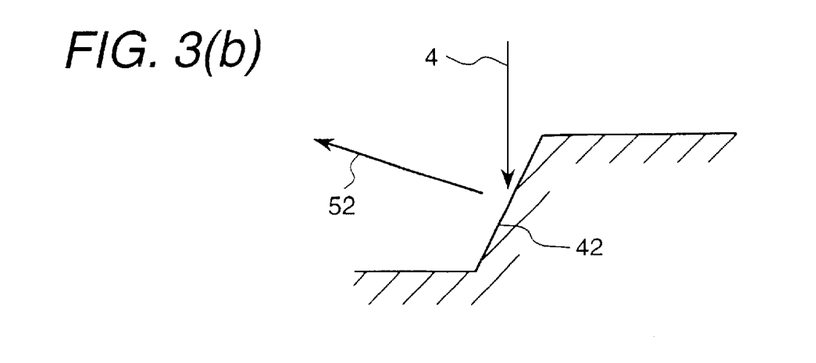

A sample image by the reflected electrons 12a detected by the detectors 10a and 10b is an image having effects of light and shade according to the irregularity of the sample 8. The reason will be explained hereunder briefly. As shown in FIGS. 1 and 2, the reflected electrons 12a reflected in a direction at a small angle with the surface of the sample 8 are assumed to rotate in a 180° arc during passing through the magnetic field of the object lens 7 and enter the detectors 10a and 10b. In this case, reflected electrons ejected at a small angle with the surface of the sample 8 on the left of FIGS. 1 and 2 are rotated in a 180° arc in the magnetic field of the object lens 7 and detected by the detector 12a installed on the right of the drawings and reflected electrons ejected at a small angle with the surface of the sample 8 on the right of FIGS. 1 and 2 are rotated in a 180° arc in the magnetic field of the object lens 7 and detected by the detector 12b installed on the left of the drawings. FIG. 3 is a schematic drawing showing a primary electron beam for irradiating the inclined part of the sample surface and reflected electrons. Assuming that on the sample surface, there is a lower right inclined part 41 as shown in FIG. 3(a) or an upper right inclined part 42 as shown in FIG. 3(b), a case that the part is scanned by the primary electron beam 4 will be considered. When the primary electron beam 4 irradiates the lower right inclined part 41 as shown in FIG. 3(a), the greater part of reflected electrons 51 emitted from the inclined part 41 is emitted in the right direction of the drawing. The reflected electrons 51 emitted in the right direction rotate in a 180° arc when they pass through the magnetic field of the object lens 7, so that many of them are detected by the detector 10b installed on the left in FIG. 1 and few of them are detected by the detector 10a on the right. Therefore, the lower right inclined part 41 as shown in FIG. 3(a) appears as a dark part in a sample image on the basis of a detection signal of the detector 10a and appears as a bright part in a sample image on the basis of a detection signal of the detector 10b. Inversely, when there is the upper right inclined part 42 as shown in FIG. 3(b) on the sample surface, most of reflected electrons 52 emitted from there move to the left of the drawing. The greater part of the reflected electrons 52 are detected by the detector 10a installed on the right of FIG. 1 and few of them are detected by the detector 10b installed on the left. Therefore, the upper right inclined part 42 as shown in FIG. 3(b) appears as a bright part in a sample image on the basis of a detection signal of the detector 10a and appears as a dark part in a sample image on the basis of a detection signal of the detector 10b.

Figure 4A:
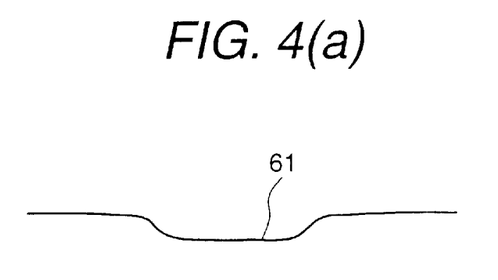
FIG. 4 is a drawing showing an example of a sample image displayed on an image display unit.
Figure 4B:
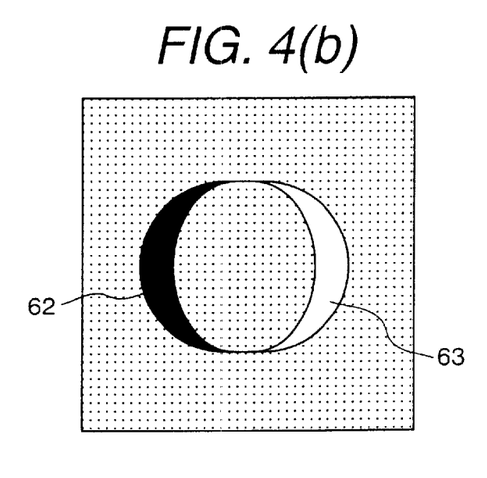
Figure 4C:
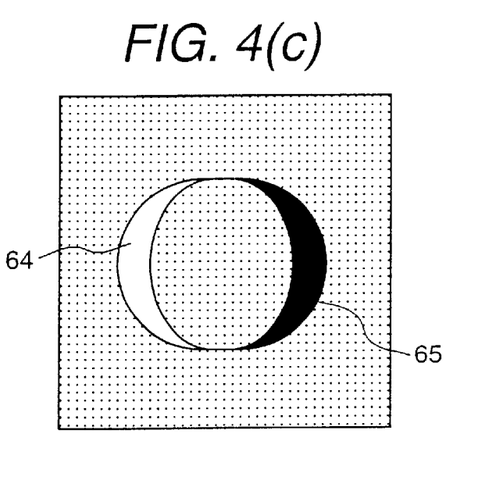

Therefore, when there is on the sample surface, for example, a circular hollow 61 smoothly changing in height whose section is shown in FIG. 4(a), a sample image formed on the basis of reflected electrons detected by the detector 10a is a shaded sample image that as shown in FIG. 4(b), a dark part 62 and a bright part 63 appear in the part equivalent to the edge of the hollow 61. In the same way, a sample image formed on the basis of reflected electrons detected by the detector 10b is also a shaded sample image that as shown in FIG. 4(c), a bright part 64 and a dark part 65 appear in the part equivalent to the edge of the hollow 61. However, the sample image shown in FIG. 4(b) and the sample image shown in FIG. 4(c) are reverse in the relationship of brightness and darkness formed in the part corresponding to the edge of the hollow 61. The parts where the brightness and darkness are reverse in the two sample images can be interpreted as parts the reflected electron emission direction is directive because the sample surfaces are inclined and the part held by the dark part 62 and the bright part 63 of the sample image shown in FIG. 4(b) (or the bright part 64 and the dark part 65 of the sample image shown in FIG. 4(c)) can be judged as an area hollowed from the periphery.

Figure 5A:
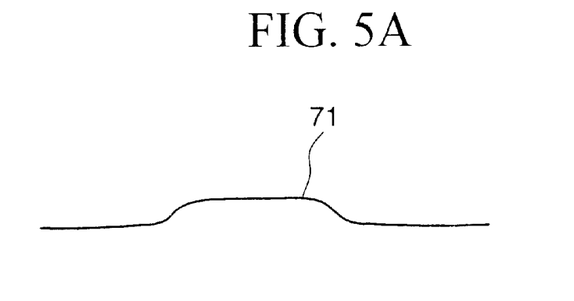
FIG. 5 is a drawing showing another example of a sample image displayed on an image display unit.
Figure 5B:
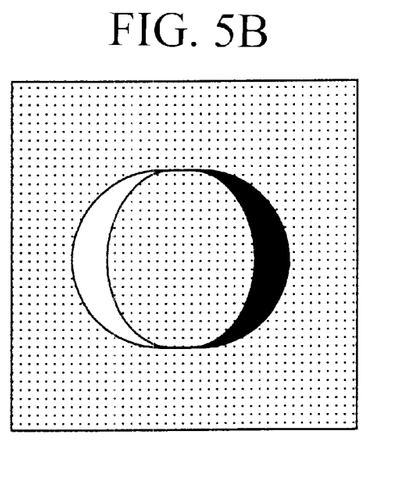
Figure 5C:
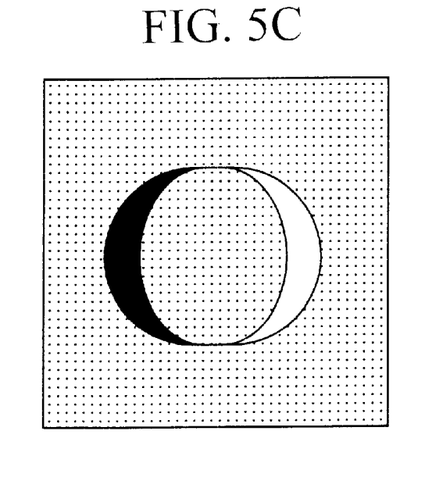
Figure 5D:
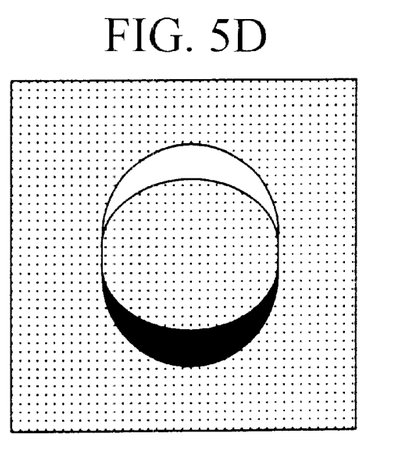
Figure 5E:
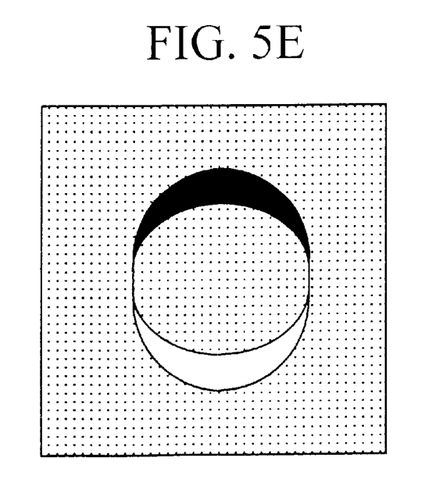

When there is a circular convex part 71 on the sample surface whose section is shown in FIG. 5(a), a reflected electron image in the area which is formed on the basis of a detection signal of the detector 10a is a shaded image as shown in FIG. 5(b) and a reflected electron image which is formed on the basis of a detection signal of the detector 10b is a shaded image as shown in FIG. 5(c). Next, it is assumed that not only a pair of detectors for detecting the reflected electrons 12a emitted in a direction at a small angle with the surface of the sample 8 is installed in the transverse direction of FIGS. 1 and 2 but also another pair of detectors is installed on this side of the paper surface and the depth side of the paper surface. Then, on the basis of a detection signal of the detector installed on this side of the paper surface, a shaded reflected electron image as shown in FIG. 5(d) is obtained and from a detection signal of the detector installed on the depth side of the paper surface, a reflected electron image as shown in FIG. 5(e) is obtained.

As mentioned above, even if only one detector for detecting the reflected electrons 12a emitted in a direction at a small angle with the surface of the sample 8 is used, irregularity information in one direction of the sample can be obtained from the brightness and darkness appearing in a reflected electron image formed using the detector. However, when a pair of detectors is arranged symmetrically about the axis of the irradiated electron beam, precise irregularity information in one direction of the sample can be obtained. Furthermore, when a plurality of pairs of detectors are arranged symmetrically about the axis of the irradiated electron beam, irregularity information of the sample surface in a plurality of directions can be obtained more precisely.

Figure 6:
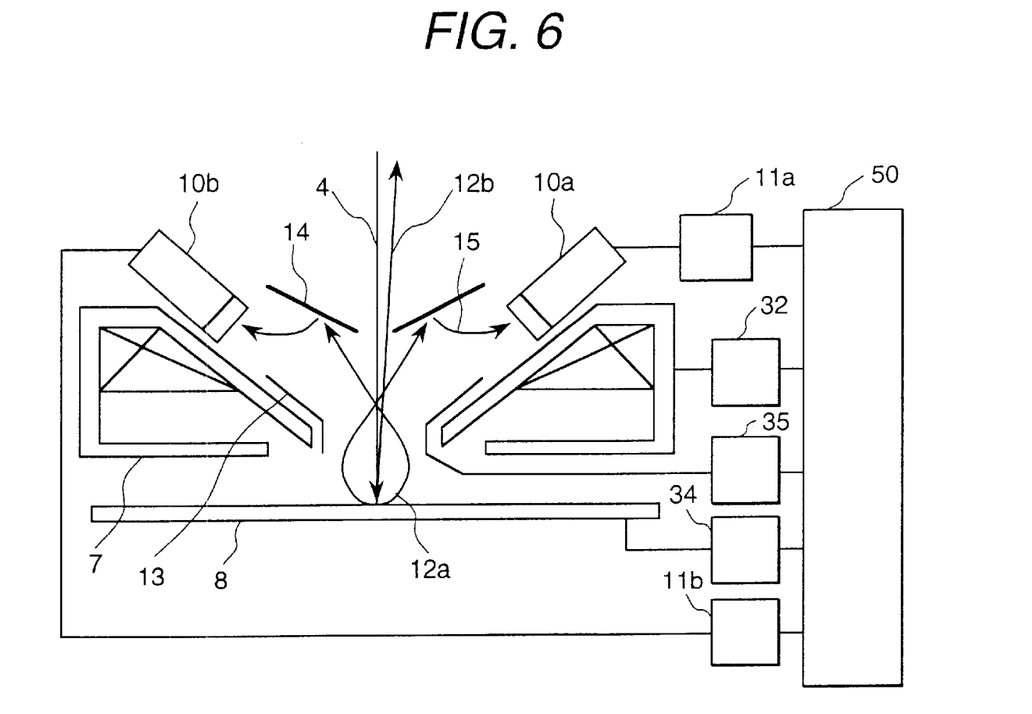
FIG. 6 is a schematic view of an essential section showing another example of a scanning electron microscope of the present invention.

FIG. 6 is a schematic view of the essential section showing another example of a scanning electron microscope of the present invention. The range of emission angle of the reflected electrons 12a with the surface of the sample 8 which can be detected by the detectors 10a and 10b varies with the voltage applied to the sample 8 and the voltage applied to the acceleration electrode 13. When the respective voltages increase, the reflected electrons 12a approaches the track of the reflected electrons 12b. If it is required to increase these voltages in connection with resolution, as shown in FIG. 6, a reflector 14 is arranged on the electron source (cathode 1) side of the object lens 17 and the reflected electrons 12a emitted in a direction at a small angle with the surface of the sample 8 collide with the reflector 14. To the detectors 10a and 10b, in order to improve the efficiency of allowing electrons to collide with the phosphor and detecting as a signal, a voltage of about +10 kV is applied. As a result, secondary electrons 15 generated by a collision with the reflected electrons 12a can be detected by the detectors 10a and 10b.

Figure 7:
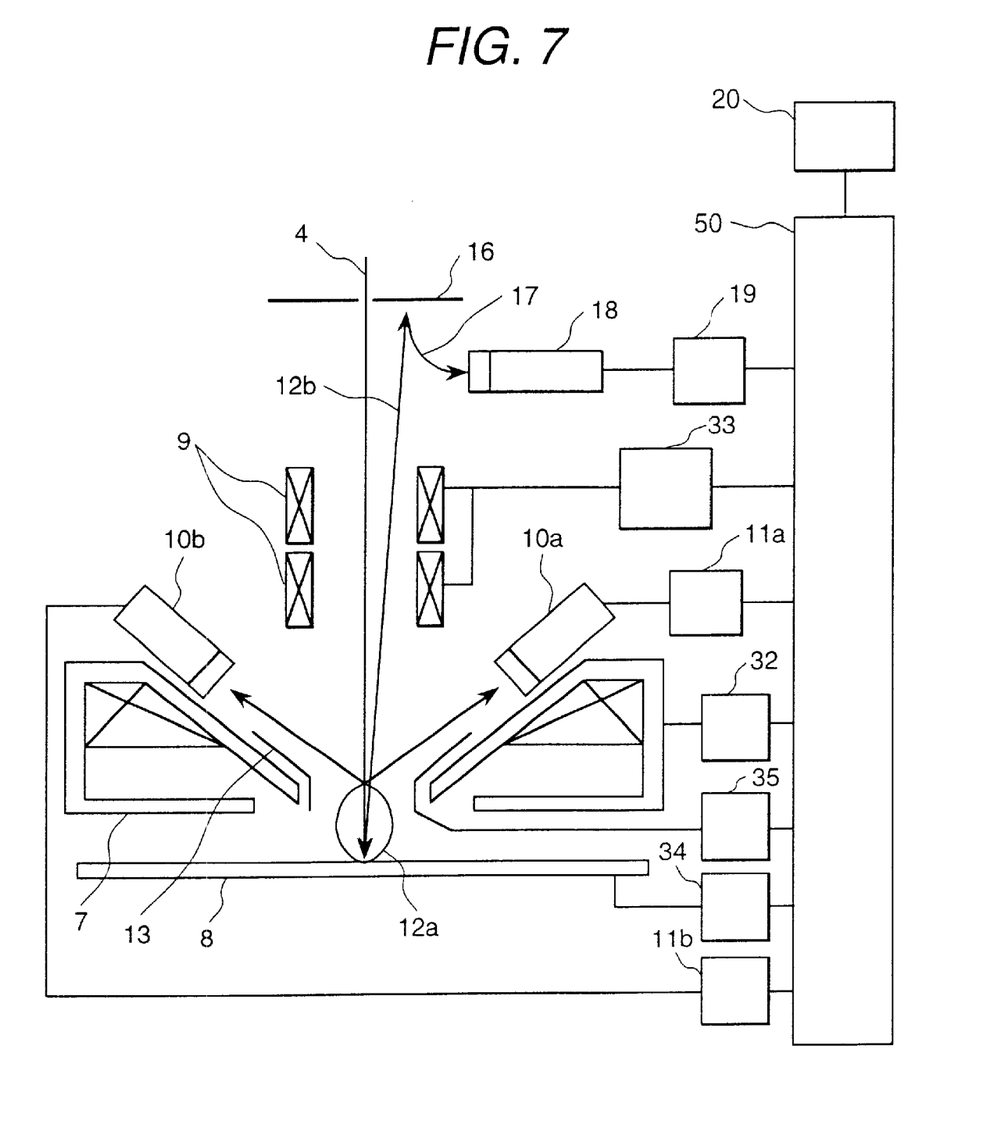
FIG. 7 is a schematic view of an essential section showing still another example of a scanning electron microscope of the present invention.

FIG. 7 is a schematic view of the essential section showing still another example of a scanning electron microscope of the present invention. The scanning electron microscope has the same structure from the cathode 1 to the limiting plate 6 as that shown in FIG. 1, so that in FIG. 7, only the downstream side of the structure from the limiting plate 6 is shown.

Secondary electrons emitted from the sample 8 by irradiation of the primary electron beam 4, when a negative voltage from several hundreds V to several kV is applied to the sample 8, pass through the object lens 7 by drawing almost the same track as that of the reflected electrons 12b emitted in a direction at a large angle (angle almost perpendicular to the surface of the sample 8) with the surface of the sample 8, so that they can be hardly detected by the detectors 10a and 10b. Even if the voltage to be applied to the sample 8 is sufficiently low or 0, when the voltage to be applied to the acceleration electrode 13 is sufficiently large, the secondary electrons draw the same track.

In order to detect the reflected electrons 12b emitted in a direction at a large angle with the surface of the sample 8 and the secondary electrons and form a sample image on the basis of a detection signal thereof, as shown in FIG. 7, a reflector 16 having a small hole through which the primary electron beam 4 can pass is arranged on the electron source (cathode 1) side of the deflecting coil 9, and secondary electrons 17 generated when the primary electron beam 4 collides with the reflector 16 are detected by an upper detector 18, amplified by an amplifier 19, and can be displayed on an image display unit 20 as a sample image.

Figure 8:
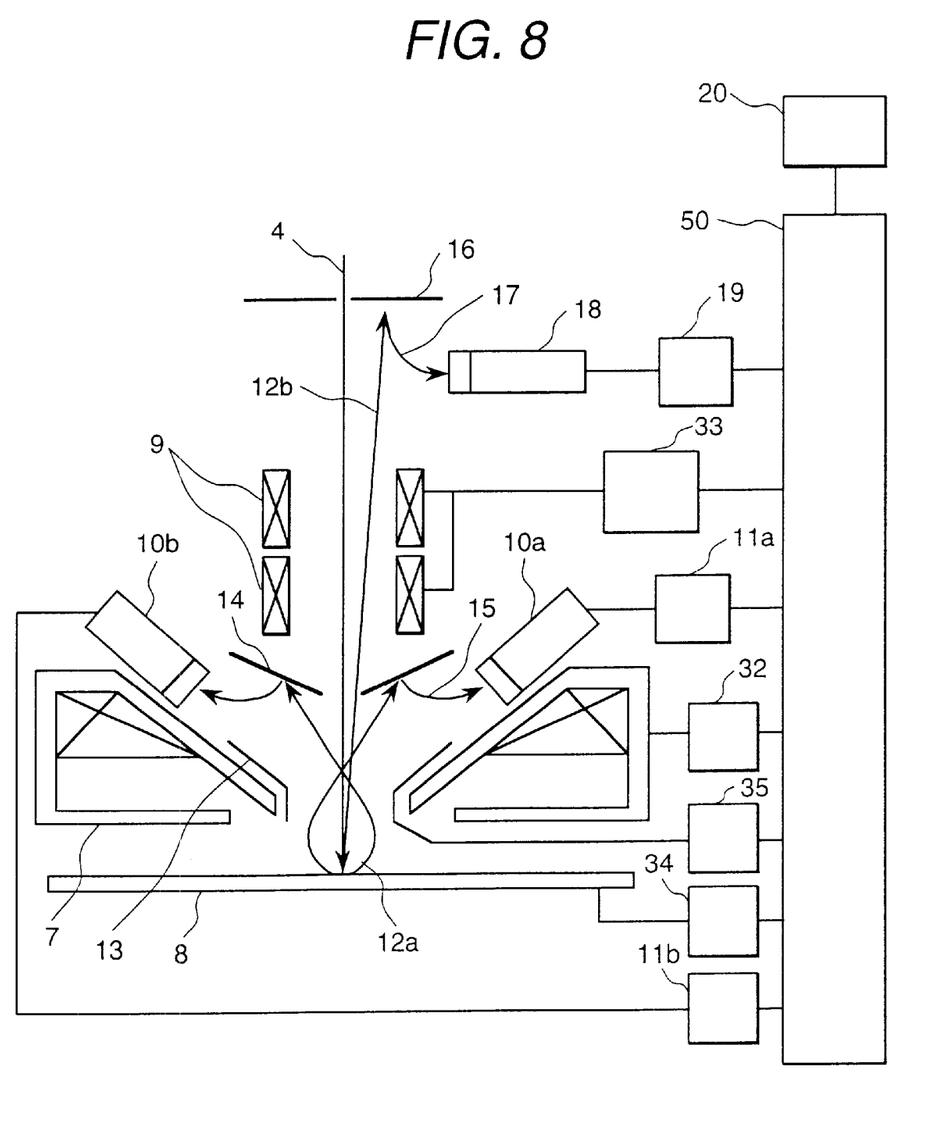
FIG. 8 is a schematic view of an essential section showing a further example of a scanning electron microscope of the present invention.

FIG. 8 is a schematic view of the essential section showing another example of a scanning electron microscope of the present invention. The scanning electron microscope has the same structure from the cathode 1 to the limiting plate 6 as that shown in FIG. 1, so that in FIG. 8, only the downstream side of the structure from the limiting plate 6 is shown.

The scanning electron microscope has the reflector 14 with which the reflected electrons 12a emitted in a direction at a small angle with the surface of the sample 8 collide and the reflector 16 with which the reflected electrons 12b emitted in a direction at a small angle with the surface of the sample 8 and the secondary electrons collide. Since the scanning electron microscope has the two reflectors 14 and 16, highly efficient detection of the reflected electrons 12a emitted in a direction at a small angle with the surface of the sample 8 and detection of the reflected electrons 12b emitted in a direction at a large angle with the surface of the sample 8 and the secondary electrons can be performed at the same time. Within the range on the sample 8 which is scanned by the deflecting coil 9, the reflected electrons 12a emitted in a direction at a small angle with the surface of the sample 8 are detected by the detectors 10a and 10b and the reflected electrons 12b emitted in a direction at a large angle with the surface of the sample 8 and the secondary electrons are detected by the upper detector 18 at the same time.

Figure 9:
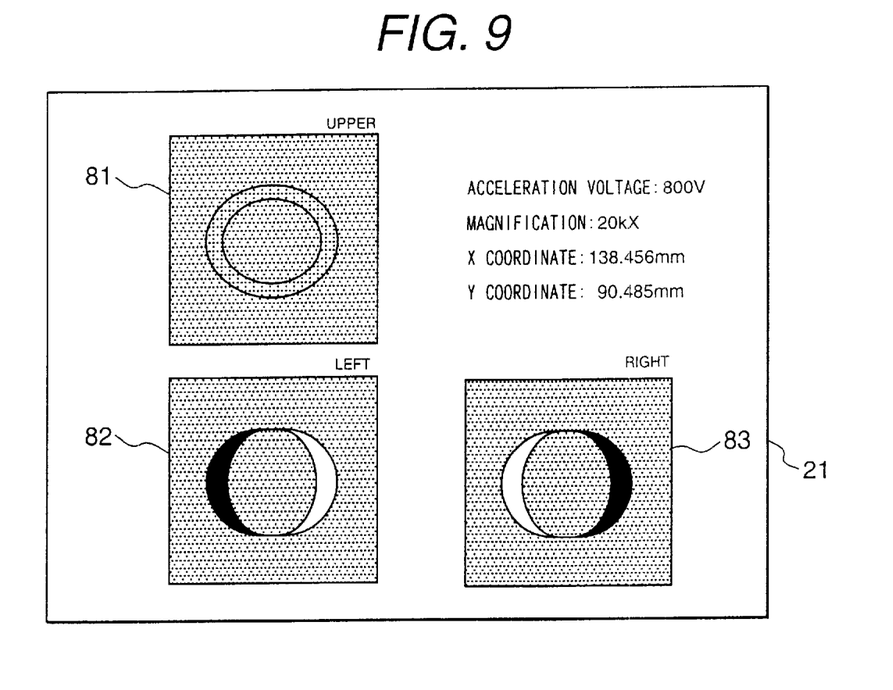
FIG. 9 is a drawing showing an example of a sample screen of an image display unit.

FIG. 9 is a drawing showing an example of a display screen 21 of the image display unit 20. FIG. 9 shows an example that together with a sample image 81 formed by a signal detected by the upper detector 18, sample images 82 and 83 formed by signals detected by the detectors 10a and 10b are displayed. "Left" and "Right" assigned to the sample images 82 and 83 are displayed for convenience and for example, for arrangement and excitation of the detectors as explained in FIG. 1, a sample image formed on the basis of reflected electrons emitted mainly in the right direction of the paper surface from the sample by irradiation of the electron beam is displayed as "Right" and a sample image formed on the basis of reflected electrons emitted mainly in the left direction of the paper surface from the sample is displayed as "Left". From the relationship of the bright part and dark part in the two sample images 82 and 83, it is found that the central part of the circular area appearing in the sample image 81 is hollowed from the periphery.

Figure 10:
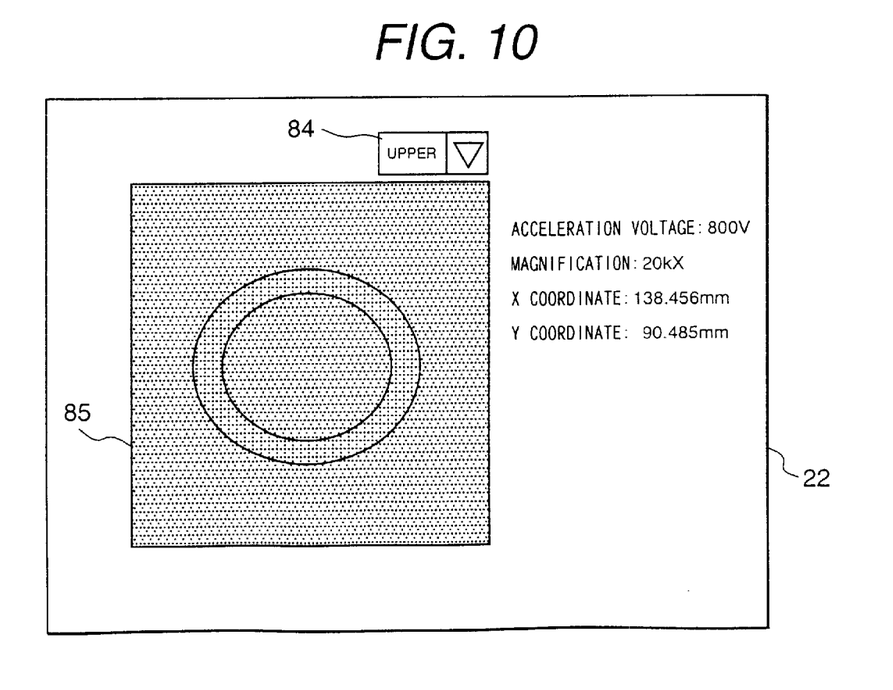
FIG. 10 is a drawing showing another example of a sample screen of an image display unit.

FIG. 10 is a drawing showing another example of a display screen 22 of the image display unit 20. In this example, a sample image to be displayed on the display screen 22 is selected from a list box 84. In the state shown in the drawing, a sample image 85 formed by a signal detected by the upper detector 18 is displayed. However, when sample images formed by signals detected by the detectors 10a and 10b are selected from the list box 84, the images 82 and 83 shown in FIG. 9 are displayed on the screen.

Figure 11:
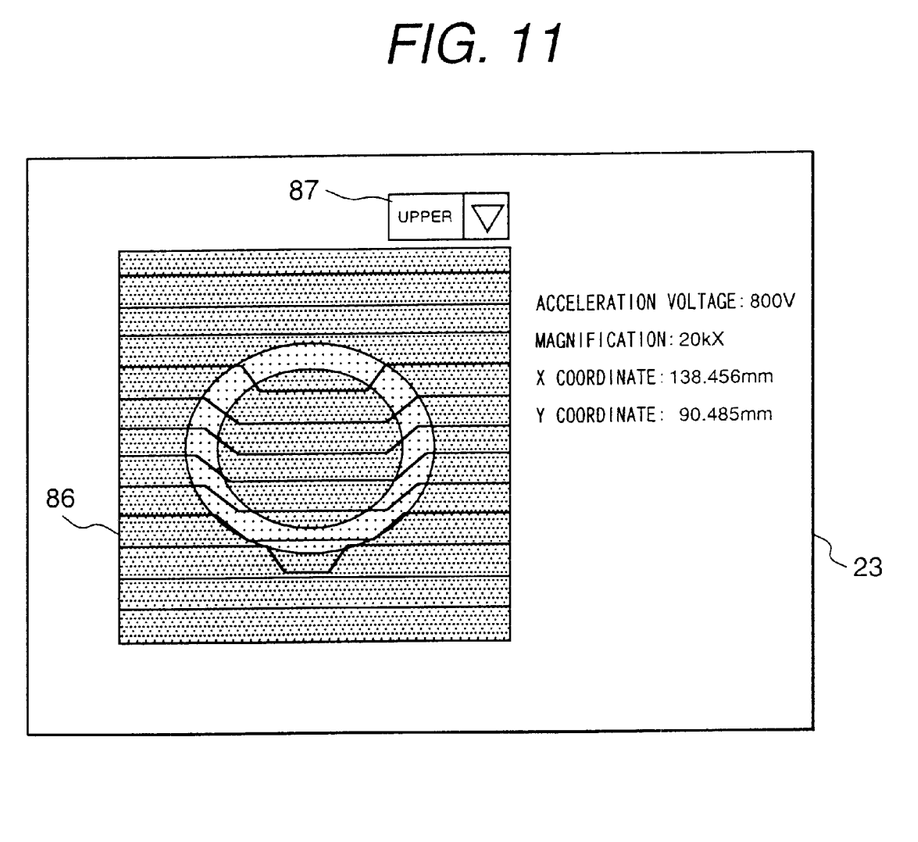
FIG. 11 is a drawing showing still another example of a sample screen of an image display unit.

FIG. 11 is a drawing showing still another example of a display screen 23 of the image display unit 20. In this example, as overlapped on a sample image 86 formed by a signal detected by the upper detector 18, the irregularity information obtained by sample images formed by signals detected by the detectors 10a and 10b is displayed. In the example shown in the drawing, the irregularity information is displayed by lateral lines symbolizing the sectional shape. By overlapping and displaying the irregularity information, it is found at a glance that the central part of the circular area appearing in the sample image 86 is hollowed from the periphery. When it is intended to see sample images formed by signals detected by the detectors 10a and 10b and they are selected from the list box, on the display screen 23, the images 82 and 83 shown in FIG. 9 are displayed in place of the sample image 86.

According to the present invention, a sample image shaded in correspondence with irregularity of the sample can be formed by a detector installed on the electron source side of an object lens and irregularity information of the sample can be obtained by observing high resolution.

What is claimed is:

1. A scanning electron microscope comprising an electron source for generating an electron beam, a focusing lens for focusing said electron beam, a magnetic field type object lens for finely limiting said focused electron beam and irradiating the same onto a sample, a deflector for two-dimensionally scanning said electron beam on said samples a detector arranged on an electron source side of said object lens so as to detect a signal emitted from said sample by irradiation of said electron beam, display means for displaying said signal detected by said detector as a sample image, deceleration electric field generation means for generating an electric field for decelerating said electron beam to be irradiated onto said sample, and voltage control means for controlling a voltage applied to said deceleration electric field generation means, wherein said voltage control means controls said voltage to be applied to said deceleration electric field generation means so that reflected electrons emitted in a direction at a small angle with said sample surface among said signal generated from said sample are detected by said detector, and a sample image having effects of light and shade in correspondence with irregularity of said sample surface can be obtained.

2. A scanning electron microscope according to claim 1, wherein said deceleration electric field generation means generates said deceleration electric field by applying a negative voltage to said sample.

3. A scanning electron microscope according to claim 1, wherein said scanning electron microscope has acceleration electric field generation means for generating an electric field for accelerating reflected electrons generated from said sample in a direction of said electron source and voltage control means for controlling a voltage to be applied to said acceleration electric field generation means.

4. A scanning electron microscope comprising an electron source for generating an electron beam, a focusing lens for focusing said electron beam, a magnetic field type object lens for finely limiting said focused electron beam and irradiating the same onto a sample, a deflector for two-dimensionally scanning said electron beam on said sample, a detector arranged on an electron source side of said object lens so as to detect a signal emitted from said sample by irradiation of said electron beam, display means for displaying said signal detected by said detector as a sample image, acceleration electric field generation means for generating an electric field for accelerating said signal generated from said sample, and voltage control means for controlling a voltage to be applied to said acceleration electric field generation means, wherein said voltage control means controls said voltage to be applied to said acceleration electric field generation means so that said reflected electrons emitted in a direction at a small angle with said sample surface among said signal generated from said sample are detected by said detector, and a sample image having effects of light and shade in correspondence with irregularity of said sample surface can be obtained.

5. A scanning electron microscope according to claim 1, wherein said object lens generates a leakage magnetic field in a sample atmosphere.

6. A scanning electron microscope according to claim 1, wherein a plurality of said detectors are installed in symmetrical positions about an optical axis of said electron beam and sample images having different effects of light and shade for said irregularity of said sample surface are obtained by detection signals of said detectors.

7. A scanning electron microscope according to claim 1, wherein said brightness and darkness of said sample image, in consideration of rotation of said reflected electrons detected by said detector due to a magnetic field of said object lens, correspond to said irregularity of said sample surface.

8. A scanning electron microscope according to claim 1, wherein said scanning electron microscope has a conductor plate having an opening for passing said electron beam on a side of said electron source of said object lens and an opening size of said conductor plate and intensity of said deceleration electric field or said acceleration electric field are set so that most of said secondary electrons emitted from said sample pass through said opening and said reflected electrons emitted in a direction at a small angle with said sample surface collide with said conductor plate.

9. A scanning electron microscope according to claim 8, wherein in a position which is expected as a detection direction of said secondary electrons emitted from said conductor plate due to collision of said reflected electrons, said detector is arranged.

10. A scanning electron microscope according to claim 1, wherein said scanning electron microscope may have a second detector on a side of said electron source of said detector and detect any one of or both of said secondary electrons generated from said sample and reflected electrons emitted in a direction at a large angle with said sample surface by said second detector.

11. A scanning electron microscope according to claim 1, wherein said sample image by said reflected electrons emitted in a direction at a small angle with said sample surface is displayed on said display means.

12. A scanning electron microscope according to claim 1, wherein irregularity information of said sample surface is displayed on said display means.

13. A scanning electron microscope according to claim 4, wherein said object lens generates a leakage magnetic field in a sample atmosphere.

14. A scanning electron microscope according to claim 4, wherein a plurality of said detectors are installed in symmetrical positions about an optical axis of said electron beam and sample images having different effects of light and shade for said irregularity of said sample surface are obtained by detection signals of said detectors.

15. A scanning electron microscope according to claim 4, wherein said brightness and darkness of said sample image, in consideration of rotation of said reflected electrons detected by said detector due to a magnetic field of said object lens, correspond to said irregularity of said sample surface.

16. A scanning electron microscope according to claim 4, wherein said scanning electron microscope has a conductor plate having an opening for passing said electron beam on a side of said electron source of said object lens and an opening size of said conductor plate and intensity of said deceleration electric field or said acceleration electric field are set so that most of said secondary electrons emitted from said sample pass through said opening and said reflected electrons emitted in a direction at a small angle with said sample surface collide with said conductor plate.

17. A scanning electron microscope according to claim 16, wherein in a position which is expected as a detection direction of said secondary electrons emitted from said conductor plate due to collision of said reflected electrons, said detector is arranged.

18. A scanning electron microscope according to claim 4, wherein said scanning electron microscope may have a second detector on a side of said electron source of said detector and detect any one of or both of said secondary electrons generated from said sample and reflected electrons emitted in a direction at a large angle with said sample surface by said second detector.

19. A scanning electron microscope according to claim 4, wherein said sample image by said reflected electrons emitted in a direction at a small angle with said sample surface is displayed on said display means.

20. A scanning electron microscope according to claim 4, wherein irregularity information of said sample surface is displayed on said display means.

21. A scanning electron microscope comprising:

an electron source for generating an electron beam;

a focusing lens for focusing said electron beam;

a magnetic field type object lens for finely limiting said focused electron beam and irradiating said electron beam onto a sample;

deceleration electric field forming means for forming a deceleration electric field for decelerating said electron beam between said object lens and said sample;

said object lens being formed for leaking a magnetic field toward said sample, a plurality of detectors being arranged on a track of a reflected electron beam passing through an opening to pass the electron beam of said object lens as deflected on a track toward said object lens by said deceleration electric field forming means and as deflected on a track toward an optical axis of the electron beam, said plurality of detectors being arranged on the track of electron beam directed in different directions in a direction perpendicular to the optical axis of said electron beam.

22. A scanning electron microscope comprising:

an electron source for generating an electron beam;

a focusing lens for focusing said electron beam;

a magnetic field type object lens for finely limiting said focused electron beam and irradiating the same onto a sample;

deceleration electric field forming means for forming a deceleration electric field for decelerating said electron beam between said object lens and said sample;

said object lens being formed for leaking a magnetic field toward said sample; and a detector arranged in a direction, to which a reflected electron beam emitted from said sample in directions other than that of the electron beam, passing an opening of said object lens as deflected on a track toward said object lens by said deceleration electric field forming means and as deflected on a track toward an optical axis of the electron beam.

* * * * *